(12) United States Patent
Sheng et al.

(10) Patent No.: US 6,674,305 B1
(45) Date of Patent: Jan. 6, 2004

(54) METHOD OF FORMING A SEMICONDUCTOR DEVICE AND STRUCTURE THEREFOR

(75) Inventors: Senpeng Sheng, Chandler, AZ (US); Frank Dover, Mesa, AZ (US); Barry Heim, Mesa, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 10/189,748

(22) Filed: Jul. 8, 2002

(51) Int. Cl.[7] .......................................... H03K 19/0175
(52) U.S. Cl. ............................. 326/81; 326/83; 326/80; 326/113; 327/534; 327/535
(58) Field of Search ............................. 326/81, 80, 83, 326/86, 113; 327/534, 535

(56) References Cited

U.S. PATENT DOCUMENTS

| | | |
|---|---|---|
| 5,451,889 A | 9/1995 | Heim et al. |
| 5,546,019 A | 8/1996 | Liao |
| 5,574,389 A | 11/1996 | Chu |
| 5,764,077 A * | 6/1998 | Andresen et al. .............. 326/34 |
| 5,828,233 A | 10/1998 | Nguyen et al. |
| 5,844,425 A | 12/1998 | Nguyen et al. |
| 5,966,026 A | 10/1999 | Partovi et al. |
| 6,043,680 A * | 3/2000 | Dasgupta ...................... 326/81 |
| 6,147,511 A | 11/2000 | Patel et al. |
| 6,150,843 A | 11/2000 | Shiffer et al. |
| 6,194,923 B1 | 2/2001 | Dicke |
| 6,313,661 B1 * | 11/2001 | Hsu .............................. 326/81 |
| 6,353,333 B1 * | 3/2002 | Curd et al. .................... 326/81 |
| 6,433,983 B1 * | 8/2002 | Fechner ....................... 361/111 |

* cited by examiner

Primary Examiner—Vibol Tan
(74) Attorney, Agent, or Firm—Robert E. Hightower

(57) ABSTRACT

A method of forming an output transistor (11) protects the output transistor (11) from overvoltage conditions on an output (13). The body of the output transistor (11) is coupled to the gate of the transistor (11) prior to the high voltage being applied to the output (13).

16 Claims, 2 Drawing Sheets

METHOD OF FORMING A SEMICONDUCTOR DEVICE AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and circuits to protect semiconductor devices from conditions that cause the output of the semiconductor device to be driven to a voltage higher than the power supply of the semiconductor device. One particular concern was protecting the semiconductor device from high voltages applied to the output by other devices that were connected to the output. Systems utilizing such different voltage supplies are often referred to as mixed mode systems or systems using mixed mode power supplies. For example, a P-channel output device required special protection when if the output were taken to a voltage that is higher than the power supply applied to the P-channel output device. One particular protection method utilized voltage threshold adjustment implants or diffusions to raise the threshold of the P-channel device to provide protection for the higher voltage conditions and to ensure that the higher voltage did not cause a malfunction of the system.

One problem of such protection methods was the cost. Increasing the threshold voltage by a threshold implant lowered the drain current that could be provided by the P-channel transistor, thus, the size of the transistor had to be increased to provide the desired current thereby increasing the manufacturing cost. Additionally, the threshold implant required additional processing steps and additional mask layers that also increased the manufacturing cost of the semiconductor device.

Accordingly, it is desirable to have a method of protecting a semiconductor device from over voltage conditions on an output that does not require a threshold adjustment to the output transistor, that does not require additional manufacturing steps, that does not require additional mask layers, that reduces the size of the output transistor, and that reduces the cost of the semiconductor device.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor.

DETAILED DESCRIPTION OF THE DRAWINGS

The present description includes a method of forming a semiconductor device having an output that is protected from overvoltage conditions applied to the output.

Figure 1:
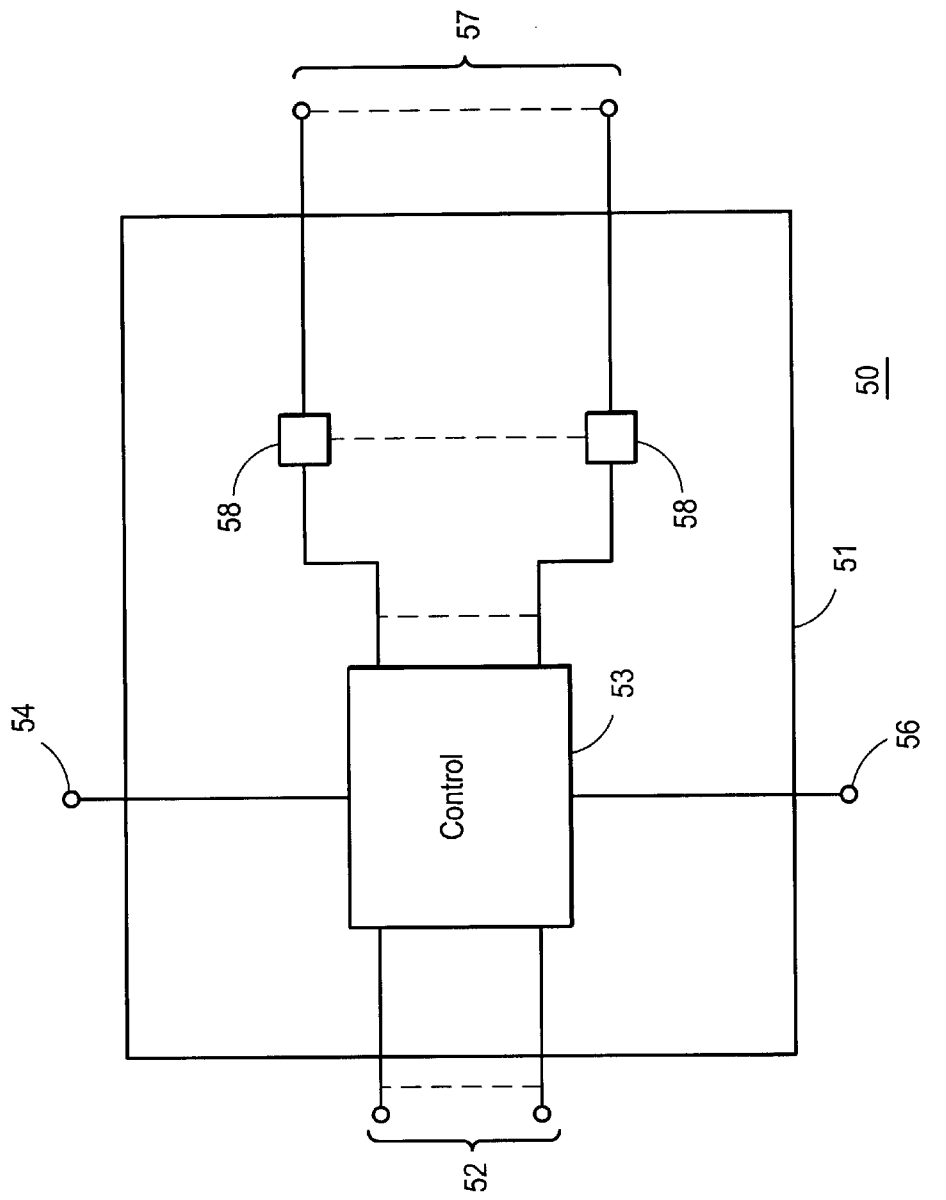
FIG. 1 graphically illustrates an enlarged plan view of an embodiment of a portion of a semiconductor device in accordance with the present invention.

FIG. 1 graphically illustrates an enlarged plan view of a portion of a semiconductor device 50 that is formed on a semiconductor die 51. Device 50 typically has an input or plurality of inputs 52 that provide information to a control circuit 53. Semiconductor device 50 receives an input voltage applied between a voltage input 54 and a voltage return 56. Device 50 also includes an output circuit or plurality of output circuits 58 that drive an output or plurality of outputs 57 of device 50. Outputs 57 generally are connected to other circuits which have outputs that can apply a second voltage value to outputs 57 that is greater than the input voltage applied to input 54. For example, the voltage applied to input 54 may have a value between approximately 2.0 to 3.5 volts. However, outputs 57 may be connected to a bus or other circuits that apply a voltage of 5.0 volts or greater to outputs 57. Such voltage differences may cause excess leakage current to flow from the higher voltage to the lower voltage and may disturb the operation of device 50. Consequently, each output circuit 58 must be protected from the higher voltage that may be applied to any output 57.

Figure 2:
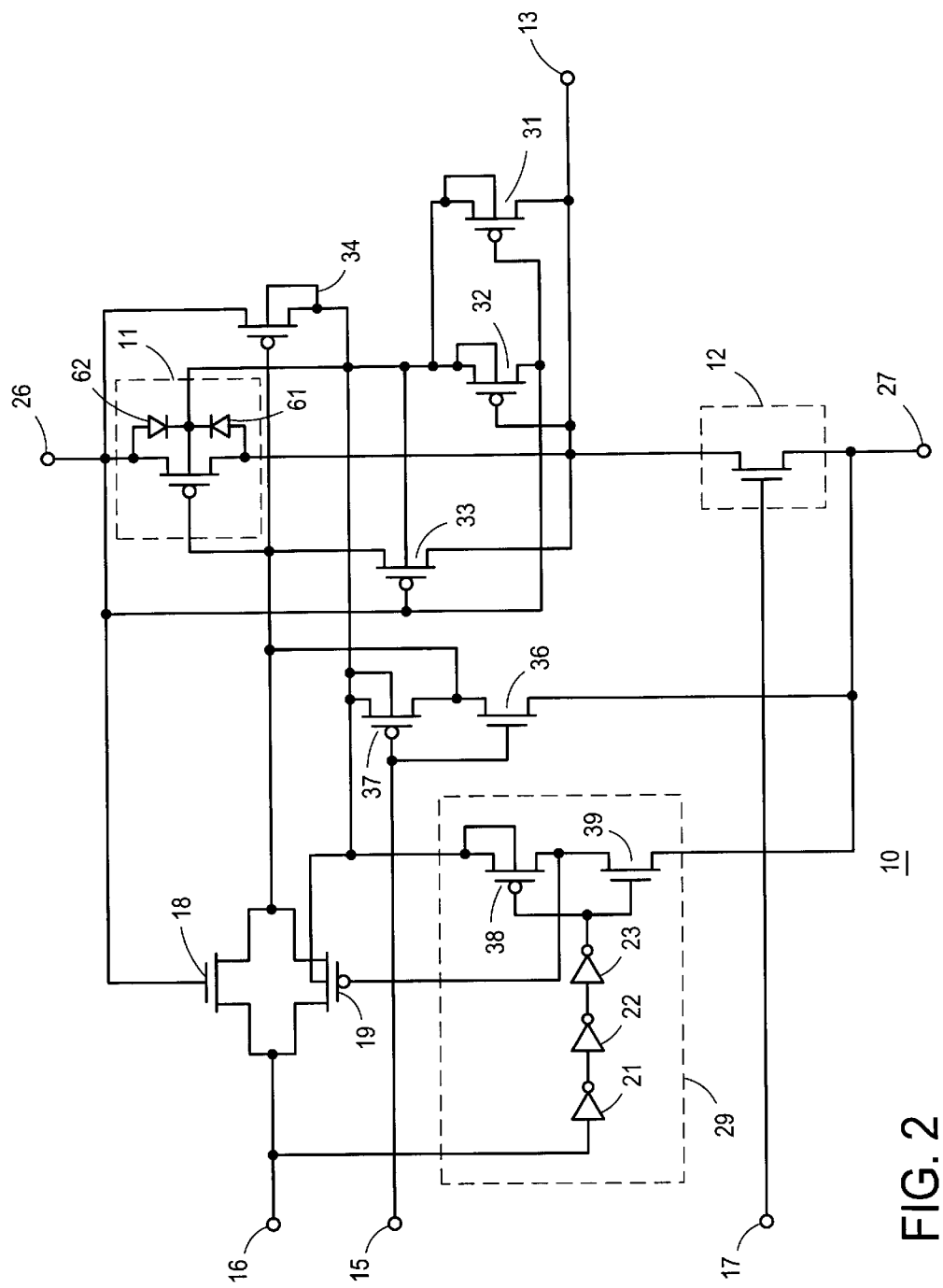
FIG. 2 schematically illustrates a portion of an embodiment of an output circuit of the semiconductor device of FIG. 1 in accordance with the present invention.

FIG. 2 schematically illustrates an embodiment of an output circuit 10 that is a portion of output circuit 58 shown in FIG. 1. Circuit 10 includes an upper output transistor 11 and a lower output transistor 12 that are connected in a totem pole arrangement between a voltage input 26 and a voltage return 27. Transistor 11 has a current carrying electrode or source connected to input 26, and a another current carrying electrode or drain connected to a current carrying electrode or drain of transistor 12 and to output 13. Transistor 11 also has two parasitic diodes. A drain-body diode 61 that has an anode connected to the drain of transistor 11 and a cathode connected to the body of transistor 11, and a source-body diode 62 that has an anode connected to the source of transistor 11 and a cathode connected to the body of transistor 11. Transistor 12 has another current carrying electrode or source connected to return 27, and a control electrode or gate is connected to a first signal input or input 17. Input 26 and return 27 may be connected to input 54 and return 56 (see FIG. 1), respectively, or may operate from a lower voltage than the input voltage applied to input 54. Thus, a first voltage value is applied to voltage input 26 that typically is less than a second voltage value that may be applied to output 13 by other circuits that typically are external to circuit 10. A second signal input or input 16 is used to control transistor 11 and input 17 is used to control transistor 12. A third signal input or input 15 supplies a signal that is opposite in polarity to the signal applied to input 16. Inputs 16 and 17 are also utilized to tri-state circuit 10 so that neither transistor 11 nor transistor 12 are driving output 13.

An optional transition circuit 29, generally illustrated by a dashed box, assists circuit 10 in providing rapid high to low transitions on output 13. A transistor 18 and a transistor 19 function as transmission gates that prevent the high voltage applied to output 13 from being applied to input 16, thus, blocking the high voltage from input 16. Also, transistors 31, 32, 33, 34, 36, and 37 function to assist protecting circuit 10 from voltages applied to output 13 that are greater than the voltage applied to input 26. In the preferred embodiment, transistors 11, 19, 31, 32, 33, 34, 37, and 38 are P-channel metal oxide semiconductor (MOS) transistors and transistors 12, 18, 36, and 39 are N-channel MOS transistors.

In order to assist in providing the protection, circuit 10 is formed to couple the control electrode or gate and the body of transistor 11 together prior to the high voltage being applied to output 13 and prior to the high voltage on output 13 being coupled to the body of transistor 11. This ensures that both the body and the control electrode or gate of transistor 11 are at the highest voltage simultaneously, thereby removing the need to have a threshold adjustment for transistor 11. Typically such high voltages are applied after output 13 is placed in a tri-state mode. When circuit 10 is placed in a tri-state mode both transistors 11 and 12 are turned-off. Afterwards, output 13 can be driven to other voltages by external circuits. To activate the tri-state mode, input 17 is driven low to disable transistor 12 and input 16 is driven high to disable transistor 11. When input 16 is driven high, the gate of transistor 37 is driven low turning-on transistor 37 to couple the gate and the body of transistor 11 together through transistor 37. Because transistor 37 is controlled by input 16, the body and gate of transistor 11 are connected together before the high voltage is applied to output 13 and before output 13 can rise to a voltage greater than input 26 thereby protecting circuit 10 and eliminating the need for a voltage threshold adjustment. Without a threshold adjustment, the threshold of transistor 11 typically is the same as the threshold of other non-threshold adjusted P-channel transistors such as transistors 31, 32, 33, and 34. This is may be referred to as the P-threshold voltage.

While the value of the voltage on output 13 is approximately between the value of the voltage on input 26 and a value that is the value of the voltage on input 26 plus the threshold voltage of transistor 31 or 33, diode 61 conducts current and pulls the body of transistor 11 to the voltage value that is applied to output 13, thereby, applying the highest voltage to the body of transistor 11. The upper limit of this voltage range is established by the voltage at which transistor 31 or 33 will become active or conductive. Once the voltage on output 13 is a value that is approximately equal to or greater than the value of the voltage on input 26 plus the threshold voltage of transistor 33, transistor 33 turns-on thereby raising the gate of transistor 11 to the voltage applied to output 13. Because transistor 37 connects the body and gate of transistor 11 together, the body of transistor 11 is also raised to the same voltage. When the voltage on output 13 rises above a value approximately equal to the voltage applied to input 26 plus the threshold voltage of transistor 31, transistor 31 turns-on applying the voltage on output 13 to the body of transistor 11 and, through the connection of transistor 37, to the gate of transistor 11 thereby further ensuring that the gate and body are at the highest voltage. Typically, the threshold voltage of transistors 31 and 33 are approximately equal so that transistors 31 and 33 become active or conductive about the same time. In some embodiments transistor 33 may be omitted. In other embodiments, both transistors 31 and 33 may be omitted and diode 61 will pull the body of transistor 11 to the voltage applied to output 13. In the preferred embodiment, transistor 33 is larger than transistor 37 and charges the gate of transistor 11 faster than transistor 37. Thus, the high voltage potential is simultaneously applied to the body and the gate of transistor 11. To provide this functionality, the gate of transistor 11 is coupled to a first current carrying electrode of transistor 37 and the body of transistor 11 is connected to a second current carrying electrode and to the body of transistor 37. The gate of transistor 37 is connected to input 15. Transistor 31 has a first current carrying electrode or drain connected to output 13, a second current carrying electrode or source connected to the body of transistor 11 and to the body of transistor 31, and a gate connected to input 26. Transistor 33 has a drain connected to output 13, a source connected to the gate of transistor 11, a gate connected to input 26, and a body connected to the body of transistor 11.

The transmission gate structure of transistors 18 and 19 function to block input 16 from the overvoltage that is applied to output 13 and to prevent such overvoltages from affecting the remainder of device 50. When input 16 is high transistor 19 is disabled. In the overvoltage condition, the gate of transistor 11 is driven to the high voltage applied to output 13 which is higher than the voltage applied to input 16 and is higher than the voltage applied to the gate of transistor 18 by input 26, thus, transistor 18 is also disabled. Thus, the high voltage applied to transistor 11 is not applied to input 16. Therefore both transistors 18 and 19 are disabled preventing any overvoltage or high voltage from affecting input 16 and any other portion of device 50.

During normal non-tri-state operation output 13 is not driven by external circuits and has a voltage that is less than the voltage applied to input 26, thus transistors 31 and 33 are not enabled, but transistor 37 is still controlled by input 16 and functions as previously described. During normal operation, when inputs 16 and 17 are low, transistor 12 is turned-off, transistor 11 is turned-on, transistor 37 is disabled. In the preferred embodiment, input 15 goes high before input 16 goes low, thus, transistor 36 is enabled to ensure the gate of transistor 11 is low before the signal applied to input 16 begins to drive the gate of transistor 11 low, thus, providing a faster transition on output 13. Because the gate of transistor 11 is low, the gate of transistor 34 is also low enabling transistor 34 to charge the body of transistor 11 to the value of the voltage on input 26. This is facilitated through a connection between a source of transistor 34 and input 26, a connection between a drain of transistor 34 and the body of transistor 11 and the body of transistor 34, and a connection between the gate of transistor 34 and the gate of transistor 11. Also in the normal operating mode when inputs 16 and 17 are high, transistor 37 is enabled, and transistor 12 is enabled such that output 13 is pulled to the low voltage value applied to return 27. When output 13 is low, transistor 32 is enabled to apply the voltage on input 26 to the body of transistor 11 and transistor 37 couples the voltage to the gate of transistor 11. Transistor 32 has a source connected to input 26, a drain and the body connected to the body of transistor 11, and has the gate connected to output 13.

Transition circuit 29 assists circuit 10 in making rapid transitions on output 13. Circuit 29 includes a transistor 38 and a transistor 39 that have gates coupled together and coupled to input 16 through a delay network of serially connected inverters 21, 22, and 23. The delay network delays the signal applied to transistor 38 and 39 from the signal applied to input 16. Transistor 38 has a source connected to the body of transistor 38, to the body of transistor 19, and to the source of transistor 37. A drain of transistor 38 is connected to the gate of transistor 19 as well as to a drain of transistor 39. Transistor 39 has a source connected to return 27. In normal operation when inputs 16 and 17 are low, transistor 12 is disabled, transistor 11 is enabled, and output 13 is driven to a high voltage by transistor 11. As previously discussed, transistor 36 is enabled to pull the gate of transistor 11 low to ensure that transistor 11 is fully enabled. Additionally, the gate of transistor 39 is high, thus, transistor 39 pulls the gate of transistor 19 low to enable transistor 19. When input 16 transitions from a low value to a high value, transistor 19 remains enabled because of the delay of inverters 21, 22, and 23, thus, transistor 19 remains enabled until after the delay provided by inverters 21, 22 and 23. When input 16 transitions to a high voltage, transistor 18 couples the voltage from input 16 to the gate of transistor 11. Because the gate of transistor 18 is connected to input 26, transistor 18 can only apply a voltage to transistor 11 that is the input voltage on input 26 minus the threshold voltage of transistor 18. Because transistor 19 remains enabled due to the delay network, the gate of transistor 11 is driven to a voltage approximately equal to the voltage applied to input 16 thereby enabling transistor 11 to turn-on at a higher voltage and providing a more rapid transition from a low voltage to a high voltage on output 13. After the delay of inverters 21, 22, and 23, transistor 19 is turned-off thereby providing the blocking function so that output 13 is quickly pulled low by transistor 12.

The functionality of circuit 29 and transistors 18 and 19 is facilitated via transistor 18 having a drain connected to the gate of transistor 11 and to a source of transistor 19. A source of transistor 18 and a drain of transistor 19 are connected to input 16. A gate of transistor 18 is connected to input 26. Additionally transistor 36 has a gate connected to the gate of transistor 37, a drain connected to the drain of transistor 37, and a source connected to return 27.

This method of forming a semiconductor device that includes output circuit 10 facilitates forming transistor 11 without using a threshold adjustment doping step or implant step. The size of transistor 11 is approximately forty to fifty per cent (40–50%) smaller than a transistor formed with such a threshold adjustment.

In view of all of the above, it is evident that a novel device and method is disclosed. Forming a semiconductor device to couple the gate to the body of the output transistor prior to the higher voltage being applied to the output facilitates forming the output transistor without a threshold adjustment doping step, thereby reducing the size of the output transistor, reducing processing steps, and reducing manufacturing costs.

What is claimed is:

1. A method of protecting a semiconductor device comprising:
    forming a semiconductor device having an output, having a voltage input coupled to receive a first voltage, and having an output transistor including forming the output transistor having a body, a control electrode, a first current carrying electrode coupled to the voltage input, and a second current carrying electrode coupled to the output; and
    forming the semiconductor device to couple the control electrode to the body prior to the output reaching a second voltage that is no less than the first voltage.

2. A method of protecting a semiconductor device comprising:
    forming a semiconductor device having an output, having a voltage input coupled to receive a first voltage, and having a P-channel output transistor that is devoid of a threshold adjustment doping including forming the output transistor having a body, a control electrode, a first current carrying electrode coupled to the voltage input, and a second current carrying electrode; and
    forming the semiconductor device to couple the control electrode to the body prior to the output reaching a second voltage that is no less than the first voltage.

3. The method of claim 1 further including forming the semiconductor device to couple the body and the control electrode of the output transistor to the output after the semiconductor device couples the control electrode to the body.

4. The method of claim 3 further including forming the output transistor to conduct current from the output to the voltage input through a drain-body diode of the output transistor after the output reaches the second voltage.

5. The method of claim 4 wherein forming the semiconductor device to couple the control electrode to the body prior to coupling the control electrode and the body to the output includes forming the semiconductor device to couple the control electrode and the body to the output no earlier than the output reaching the second voltage.

6. The method of claim 4 wherein forming the semiconductor device to couple the control electrode to the body prior to coupling the control electrode and the body to the output includes coupling the output transistor to receive a first control signal on a control electrode and coupling a first transistor to receive a second control signal that is opposite to the first control signal and responsively couple the control electrode of the output transistor to the body of the output transistor.

7. The method of claim 4 wherein forming the semiconductor device to couple the control electrode to the body prior to coupling the control electrode and the body to the output includes forming a first transistor coupled to apply the output to the body of the output transistor upon the output reaching approximately the second voltage.

8. The method of claim 4 wherein forming the semiconductor device to couple the control electrode to the body prior to coupling the control electrode and the body to the output includes forming a first transistor coupled to apply the output to the control electrode of the output transistor upon the output reaching approximately the second voltage.

9. A method of protecting a semiconductor device comprising:
    forming a semiconductor device having a voltage input coupled to receive a first voltage, having an output, and having an output transistor;
    forming the output transistor having a body, a first current carrying electrode coupled to the voltage input, a control electrode, and a second current carrying electrode coupled to the output; and
    coupling the control electrode to the body prior to coupling the control electrode and the body to the output.

10. A method of protecting a semiconductor device comprising:
    forming a semiconductor device having a voltage input coupled to receive a first voltage, having an output, and having an output transistor;
    forming the output transistor having a body, a first current carrying electrode coupled to the voltage input, a control electrode, and a second current carrying electrode coupled to the output; and
    coupling the output transistor to receive a first control signal on a control electrode and coupling a first transistor to receive a second control signal that is opposite to the first control signal and responsively couple the control electrode to the body prior to coupling the control electrode and the body to the output.

11. The method of claim 9 further including coupling a first transistor to apply the output to the body of the output transistor upon the output reaching approximately a second voltage and coupling a second transistor to apply the output to the control electrode of the output transistor upon the output reaching approximately the second voltage.

12. The method of claim 9 further including coupling an input signal through a first transmission gate and a second transmission gate to the control electrode of the output transistor and further including disabling the first transmission gate a first time after the input signal reaches a high value.

13. A semiconductor device having a structure comprising:
- a first transistor having a first current carrying electrode coupled to a voltage input, a control electrode coupled to receive a first signal on a first signal input of the semiconductor device, a body, and a second current carrying electrode coupled to an output of the semiconductor device, the first transistor having a threshold voltage;
- a second transistor having a first current carrying electrode coupled to the body of the first transistor, a second current carrying electrode coupled to the control electrode of the first transistor, and a control electrode coupled to receive a second signal on a second signal input of the semiconductor device wherein the second signal is approximately opposite in polarity to the first signal, the second transistor having the threshold voltage;
- a third transistor having a first current carrying electrode coupled to the output, a second current carrying electrode coupled to the body of the first transistor, and a control electrode coupled to the voltage input, the third transistor having the threshold voltage; and
- a fourth transistor having a first current carrying electrode coupled to the output, a second current carrying electrode coupled to the control electrode of the first transistor, and a control electrode coupled to the voltage input, the fourth transistor having the threshold voltage.

14. The semiconductor device of claim 13 further including a fifth transistor having a first current carrying electrode coupled to the control electrode of the first transistor, a second current carrying electrode coupled to receive the first signal, and a control electrode coupled to a first current carrying electrode of a sixth transistor, the sixth transistor having a second current carrying electrode coupled to the body of the first transistor, and a control electrode coupled to receive the second signal.

15. The semiconductor device of claim 14 further including the sixth transistor having the control electrode coupled to a delay network that delays the second signal prior to the sixth transistor receiving the second signal.

16. The semiconductor device of claim 15 further including a seventh transistor having a first current carrying electrode coupled to the output, a second current carrying electrode coupled to a voltage return, and a control electrode coupled to receive the second signal, and further including an eighth transistor having a first current carrying electrode coupled to the voltage input, a control electrode coupled to the output, and a second current carrying electrode coupled to the body of the first transistor, and further including a ninth transistor having a first current carrying electrode coupled to the voltage input, a second current carrying electrode coupled to the body of the first transistor, and a control electrode coupled to the control electrode of the first transistor.

* * * * *